(12) United States Patent
Rupp et al.

(10) Patent No.: US 6,365,494 B2
(45) Date of Patent: Apr. 2, 2002

(54) METHOD FOR PRODUCING AN OHMIC CONTACT

(75) Inventors: Roland Rupp, Lauf; Arno Wiedenhofer, Regensburg, both of (DE)

(73) Assignee: SiCED Electronics Development GmbH & Co. KG., Erlangen (DE)

( * ) Notice: Subject to any disclaimer, the term of this patent is extended or adjusted under 35 U.S.C. 154(b) by 0 days.

(21) Appl. No.: 09/816,921

(22) Filed: Mar. 23, 2001

Related U.S. Application Data

(63) Continuation of application No. PCT/DE99/02875, filed on Sep. 10, 1999.

(30) Foreign Application Priority Data

Sep. 23, 1998 (DE) .......................................... 198 43 648

(51) Int. Cl.$^7$ .......................... H01L 21/31; H01L 21/469
(52) U.S. Cl. ....................... 438/571; 438/523; 438/572; 438/582; 438/602; 438/607; 438/931
(58) Field of Search ................................. 438/523, 571, 438/572, 582, 602, 607, 931

(56) References Cited

U.S. PATENT DOCUMENTS

| | | |
|---|---|---|
| 4,990,994 A | 2/1991 | Furukawa et al. |
| 5,389,799 A | 2/1995 | Uemoto |
| 5,397,717 A | 3/1995 | Davis et al. |
| 5,409,859 A | 4/1995 | Glass et al. |
| 5,612,232 A | 3/1997 | Thero et al. |

FOREIGN PATENT DOCUMENTS

DE  2 028 076  9/1971

OTHER PUBLICATIONS

Status of Silicon Carbide (SiC) as a wide-bandgap semiconductor for high-temperature applications: a review, (Casady et al.).
Japanese Patent Abstract No. 58–138027 (Mizuguchi), dated Aug. 16, 1983.
"Effect of reaction products in monocrystalline β–SIC/metal contact on contact resistivity", dated 1994, Inst. Phys. Conf. Ser. No. 137, Chapter 6, pp. 663–666.
Abstract of Appl. Phys. Lett. 46 (8), dated Apr. 15, 1985, American Institute of Physics, pp. 766–768.

*Primary Examiner*—John F. Niebling
*Assistant Examiner*—David A Zarneke
(74) *Attorney, Agent, or Firm*—Herbert L. Lerner; Laurence A. Greenberg; Werner H. Stemer

(57) ABSTRACT

A component is produced on a substrate made of SiC. The component has at least one ohmic contact and at least one Schottky contact. The component is brought to a temperature of more than 1300° C. at least during the growth of an epitaxial layer. To ensure that the production of the ohmic contact does not lead to impairment of other structures on the component and that the ohmic contact, for its part, is insensitive with respect to later method steps at high temperatures, the first metal is applied to the substrate for the ohmic contact before the epitaxial layer is grown.

5 Claims, 2 Drawing Sheets

METHOD FOR PRODUCING AN OHMIC CONTACT

CROSS-REFERENCE TO RELATED APPLICATION

This application is a continuation of copending International Application No. PCT/DE99/02875, filed Sep. 10, 1999, which designated the United States.

BACKGROUND OF THE INVENTION

Field of the Invention

The invention relates to a method for producing a component having a substrate made of SiC, which comprises at least one ohmic contact and at least one Schottky contact. The invention relates, in particular, to a method in which—possibly repeatedly—temperatures in excess of about 950° C. are reached.

In order to actually achieve the theoretically very low on-state losses of SiC components such as Schottky and pn diodes or else FETs in real structures, it is necessary for ohmic contacts to be available whose contact resistance is so low that it is negligible relative to the internal resistance of the component. A value of below $10^{-5}$ $\Omega$ cm$^2$ is generally sought for this contact resistance. Furthermore, this contact must be stable, i.e. its electrical properties, for example, must not be impaired in the event of exposure to a temperature of up to 300° C.

These requirements have been met heretofore only with ohmic contacts which are produced as alloyed Ni contacts on n-doped SiC. In that case, the alloying of the contact has to be carried out at temperatures of at least 950° C. Other metals such as, for example, Ti can, with specific surface preparations, also yield an ohmic contact with sufficiently low resistance directly after the deposition, but subsequent thermal loading leads to unacceptable irreversible impairment of the ohmic contact at a temperature as low as 150° C.: after brief heating to 300° C., the ohmic contact already exhibits Schottky behavior. Thus, the contact using Ti does not represent a viable alternative to the conventional Ni contact.

One example of the difficulty in coordinating the contact production and other process steps with one another in such a way that they do not adversely affect one another is the process for producing Schottky diodes: it is endeavored to apply the Schottky metal (Ti or else Ni) to the SiC surface by sputtering or vapor deposition directly after a high-temperature annealing step at more than 1400° C. under a hydrogen atmosphere. After the annealing process, the surface is in a state which is highly suitable for the production of the Schottky contact. However, if an ohmic contact is subsequently produced on the rear side of the wafer, which contact must be subjected to heat treatment at 950° C. as described above, then the Schottky metallization layer on the front side has lost its rectifying behavior as a result of the heat treatment. Therefore, the current procedure is as follows: after the hydrogen annealing, firstly the rear-side contact is produced and then e.g. wet-chemical steps are carried out in an attempt to condition the front side in such a way that it is suitable for the Schottky metallization. In that case, the reproducibility and the rectifying behavior are generally distinctly poorer than directly after the heat treatment in a hydrogen atmosphere.

Thus, as a result of the necessary annealing step for alloying Ni at 950° C., significant limitations arise with regard to the sequence of the overall process in the production of the component.

The Patent Abstract pertaining to Japanese patent application JP 58-138027 discloses the general production of an ohmic Ni contact on an SiC substrate by vaporization of metal and subsequent heating of the substrate. However, there is no indication in respect of the order of the method steps and, in particular, in respect of the position of the step in which metal is deposited on the substrate, in a method for producing components having an ohmic contact and having a Schottky contact.

German published patent application DE 20 28 076 A specifies a method with which a reliable metallic contact is produced on an SiC semiconductor at a comparatively low temperature of e.g. 700° C. The position of the step in which metal is deposited on the semiconductor is once again not revealed in DE 20 28 076 A.

U.S. Pat. No. 5,389,799 describes a semiconductor device during whose production the metal for an ohmic contact is implemented after a process of epitaxial growth.

U.S. Pat. No. 5,409,859 describes a method for producing an ohmic contact made of platinum on SiC. There, a doped SiC layer is produced on a p-type SiC single crystal, and a layer of platinum is deposited on that in order to produce the ohmic contact. Annealing (=heating to an elevated temperature) can be effected after implantation of impurity atoms into the SiC layer (post-implant annealing). Annealing of the ohmic contact can additionally be carried out. Whereas the first annealing is carried out before the deposition of the (platinum) metal, the second annealing takes place after the deposition of the (platinum) metal.

SUMMARY OF THE INVENTION

It is an object of the present invention, then, to specify a method for producing components having at least one ohmic contact and at least one Schottky contact which overcomes the disadvantages associated with the prior art and in which the production of the ohmic contact does not lead to an impairment of other structures on the component and the ohmic contact, for its part, is insensitive with respect to later method steps at high temperatures.

With the above and other objects in view there is provided, in accordance with the invention, a method for producing a component, which comprises the following method steps:

providing a substrate made from SiC (silicon carbide);

applying a first metal for an ohmic contact on one side of the substrate;

subsequently growing an epitaxial layer on the other side of the substrate at a temperature of more than 1300° C.; and applying a second metal for the Schottky contact on the epitaxial layer at a high temperature.

The invention is based on combining the heat treatment which is repeatedly necessary during the production of the SiC component, i.e. on forming the production of the ohmic contact as early as during the post-implant annealing or during the epitaxy. This results in the greatest possible tightening of the production process.

The novel method for producing a component having a substrate made of SiC, which comprises at least one ohmic contact, which method includes, in addition to the step of applying a first metal layer for the ohmic contact, at least one step in which the substrate is brought to a high temperature, is wherein the first metal layer for the ohmic contact is applied before the last step in which the substrate is brought to a high temperature.

In accordance with an added feature of the invention, the first metal for the ohmic contact is Nb, Ta, Mo, or W.

In particular, it is thus possible to produce a Schottky diode on an SiC substrate by a first metal layer for an ohmic contact being applied on the substrate, an epitaxial layer then being applied on the substrate at a temperature of more than 1300° C., and the Schottky contact subsequently being produced by the application of a second metal to the epitaxial layer. These method steps may also be followed by a heat treatment and a cooling process, the application of a contact reinforcing layer on the Schottky contact, patterning of the Schottky metal, application of a contact reinforcing layer to the metal of the ohmic contact on the second side (rear side) of the substrate and also, under certain circumstances, the separation of the substrate into individual chips. In this case, the heating of the substrate during the epitaxy is utilized according to the invention for the production of the ohmic contact. In accordance with an additional feature of the invention, the second metal for the Schottky contact is Ti or Ni.

In a preferred embodiment of the method, the epitaxy and a possible subsequent heat treatment are carried out in a hydrogen atmosphere or in an argon atmosphere.

In order to produce a so-called guard ring on the surface of the component for the purpose of improving the field profile at the edge of the component, the following steps are carried out before the first metal is applied to the rear side of the substrate: growth of an epitaxial layer, production of an implantation mask over the surface of the epitaxial layer, so that an edge region remains free, implantation of impurity atoms in the edge region, thereby producing an implanted edge (guard ring), removal of the implantation mask. This is followed by the application of the rear-side metal and then the heat-treatment step which is necessary for activating the implanted impurity atoms. In other words, the first metal is applied to the rear side of the substrate before the last step of the production method in which the component is brought to a high temperature.

The annealing for activating the implanted ions is preferably carried out at 1400° C. to 1700° C. for a duration of up to one hour and under an argon or hydrogen atmosphere. The cooling of the component after the annealing is carried out, in particular, under a hydrogen atmosphere.

The implantation can be carried out in such a way as to produce a so-called box profile with an impurity atom concentration which is essentially constant over a predetermined depth below the surface of the substrate.

The separation of the individual chips, referred to as dicing, is preferably effected by sawing the substrate.

The method according to the invention has the advantage that the overall process for producing the component is significantly simplified and accelerated. Furthermore, as a result of the possible Schottky metallization directly after the epitaxy or a possible heat treatment under hydrogen, the quality and yield (reproducibility) are increased in the case of Schottky diodes, and the resulting ohmic rear-side contact is stable up to in excess of 1000° C. Consequently, the resulting ohmic rear-side contact is also of interest for the production of components for high-temperature applications, such as e.g. JFETs.

Other features which are considered as characteristic for the invention are set forth in the appended claims.

Although the invention is illustrated and described herein as embodied in a method for producing an ohmic contact, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
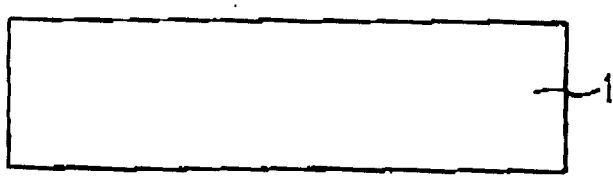
FIGS. 1A to 1E are diagrammatic sectional views of the sequence of the method according to the invention using a first Schottky diode.
Figure 1:
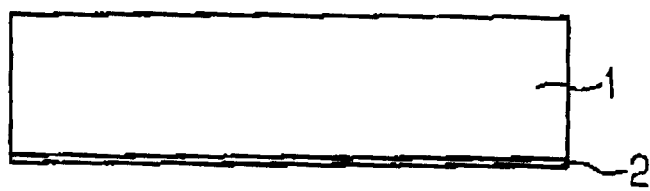
Figure 1:
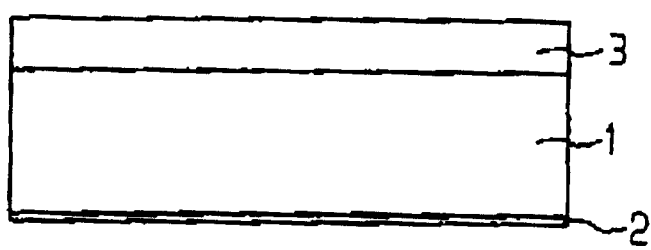
Figure 1:
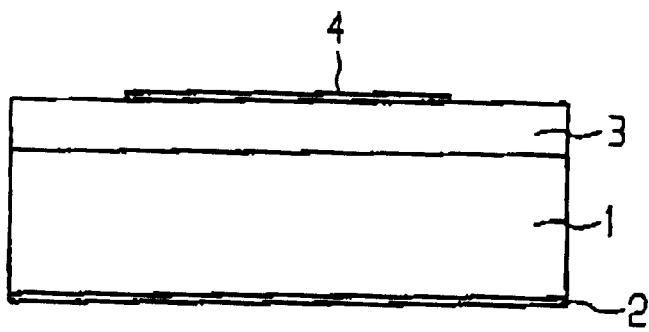
Figure 1:
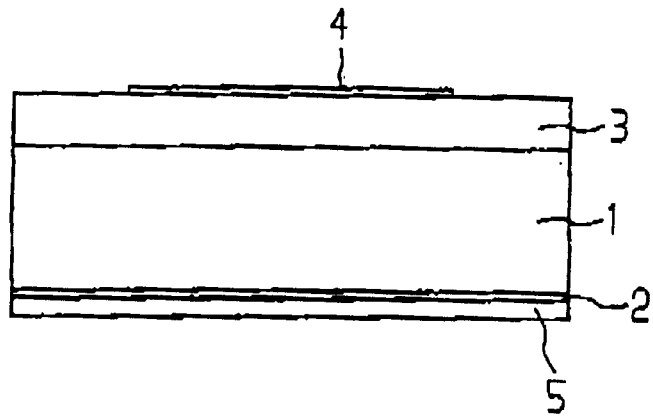

Referring now to the figures of the drawing in detail and first, specifically to the sequence of FIGS. 1A to 1E, there is shown a first Schottky diode in cross section. The Schottky diode comprises an SiC (silicon carbide) substrate 1, on which an ohmic contact and a Schottky contact are to be produced (FIG. 1A).

A first metal for an ohmic contact 2 (FIG. 1B) is applied to the substrate 1, on a second side (rear side) of the substrate. In this case, however, Ni is not suitable as contact material owing to the high temperatures during at least a few heat treatment steps, since this metal, at temperatures significantly below 1300° C., can already propagate very far in the SiC wafer by diffusion along dislocations, and thus adversely effects the electrical properties of the semiconductor. Moreover, Ni can evaporate and thus contaminate the process atmosphere. As a result, uncontrolled soiling of the surface which is intended to be prepared for the Schottky metallization by this heat-treatment step is virtually unavoidable. It has been found, however, that the metals Nb, Ta, Mo, W are suitable for ohmic contact formation at 1300° C. to 1700° C. under hydrogen, without exhibiting the disadvantages of Ni. At high temperatures, all these metals form a readily conducting intermediate layer with SiC which comprises metal carbides and/or silicides. The first metal is therefore preferably niobium, tantalum, molybdenum or tungsten.

As the next step, as shown in FIG. 1C, in the method according to the invention, an epitaxial layer 3 is allowed to grow on a first side (front side) of the substrate 1. A second metal layer 4 is applied on the epitaxial layer 3 (FIG. 1D), thereby producing a Schottky contact on the epitaxial layer 3. The metal used for the Schottky contact may be Ti or Ni, for example.

According to the invention, after the application of metal, the heat treatment and cooling of the substrate for growing the epitaxial layer 3 and the thermal formation of the ohmic contact between the first metal and the rear side are combined in one step. The heat treatment and the cooling process are preferably carried out in a hydrogen atmosphere or in an argon atmosphere with temporary addition of silane, silicon hydrides, or hydrocarbons.

Finally, in order to complete the component, the following may also be carried out: the application of a contact reinforcing layer to the Schottky metal 4, patterning of the Schottky metal 4, the application of a contact reinforcing layer 5 to the metal 2 on the rear side of the substrate 1 (FIG. 1E) and the separation into individual chips (i.e., dicing), for instance by wafer sawing.

Figure 2A:
FIGS. 2A to 2F are diagrammatic sectional views of the sequence of the method according to the invention using a second Schottky diode.
Figure 2B:
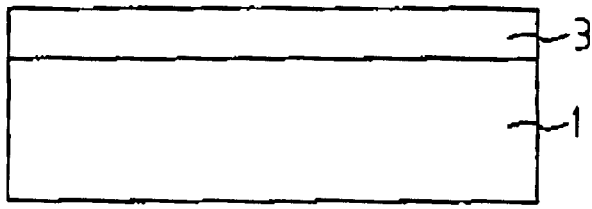
Figure 2C:
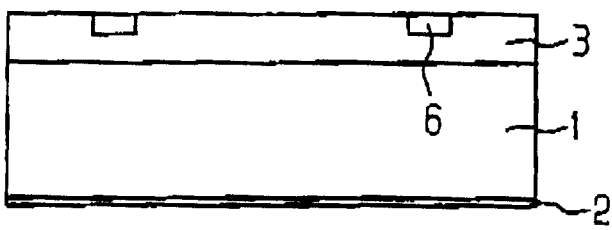

FIGS. 2A to 2F illustrate the method for producing a Schottky diode with a so-called guard ring. The guard ring serves for changing the field distribution at the edge of the component in such a way that the edge leakage current produced on account of the inhomogenous distribution of the electric field at the edge of the metal layer is suppressed or at least reduced. In order to produce the guard ring, an epitaxial layer 3 is grown before the first metal 2 is applied to the rear side of the substrate 1 (FIGS. 2A and 2B). A non-illustrated implantation mask is subsequently produced over the surface of the epitaxial layer, so that an edge region of the surface of the component remains free. Impurity atoms are implanted in this edge region (FIG. 2C), thereby producing an implanted edge 6, which is referred to as guard ring or as junction terminated extension (JTE). The implanted edge 6 is doped differently from the epitaxial layer 3, that is to say has a different conductivity type. In particular, the implantation can be effected in such a way as to produce a so-called box profile with a doping concentration which remains constant over a predetermined depth proceeding from the surface of the substrate.

Figure 2D:
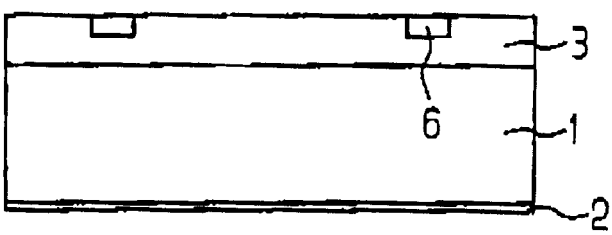
Figure 2E:
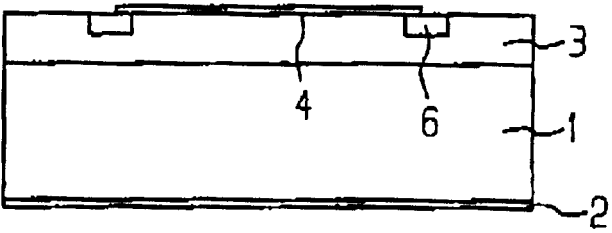
Figure 2F:
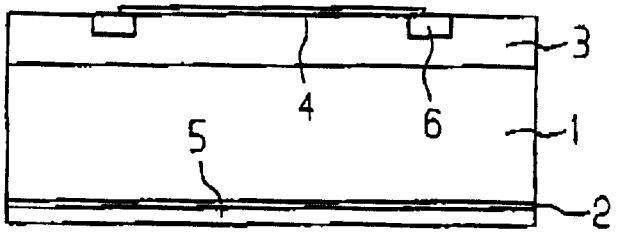

The implantation mask is then removed, and the method according to the invention as described with reference to FIG. 1 then follows (FIGS. 2D and 2F). Firstly, the metal for the ohmic contact is applied on the rear side of the substrate (still FIG. 2C). In FIG. 2D, the necessary annealing for activating the implanted ions and, at the same time, for forming the ohmic contact is carried out e.g. at 1400° C. to 1700° C. over the duration of up to one hour under an argon or hydrogen atmosphere. The subsequent cooling of the substrate is preferably carried out under a hydrogen atmosphere. In FIG. 2E, the Schottky contact is produced and, if appropriate, patterned. In FIG. 2F, a contact reinforcing layer 5 is once again applied on the metal of the rear-side contact 2, as in FIG. 1E.

By virtue of the method according to the invention, processes which have hitherto been deemed to be completely independent, namely the preparation of the front side of an SiC wafer for the Schottky metallization and the formation of the ohmic rear-side contact, are combined to form one process. This prevents these processes from adversely affecting one another in an undesirable manner, which has been unavoidable in prior art processes.

We claim:

1. A method for producing a component, which comprises the following method steps:

providing a SiC substrate with a first side and a second side;

applying a first metal for an ohmic contact on the second side of the substrate;

subsequently growing an epitaxial layer on the first side of the substrate at a temperature of more than 1300° C.; and applying a second metal for the Schottky contact on the epitaxial layer at a high temperature.

2. The method according to claim 1, which comprises selecting the first metal for the ohmic contact from the group of metals consisting of Nb, Ta, Mo, and W.

3. The method according to claim 1, which comprises selecting the second metal for the Schottky contact from the group of metals consisting of Ti and Ni.

4. The method according to claim 1, wherein the growing step comprises performing epitaxy in a hydrogen atmosphere or in an argon atmosphere with an addition of a material selected from the group consisting of silane, silicon hydrides, and hydrocarbons at a temperature of more than 1300° C.

5. The method according to claim 4, which further comprises carrying out a heat treatment subsequently to the epitaxy.

* * * * *